(12) United States Patent
Dallmann et al.

(10) Patent No.: US 10,061,874 B2
(45) Date of Patent: Aug. 28, 2018

(54) METHOD FOR MONITORING A PROCESS AND/OR PRODUCTION PLANT

(71) Applicant: Siemens Aktiengesellschaft, Munich (DE)

(72) Inventors: Michael Dallmann, Wendelstein (DE); Jürgen Elger, Pyrbaum (DE); Christiane Gast, Nürnberg (DE); Markus Remmel, Karlsruhe (DE); Thomas Trenner, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 887 days.

(21) Appl. No.: 14/277,132

(22) Filed: May 14, 2014

(65) Prior Publication Data

US 2014/0343911 A1 Nov. 20, 2014

(30) Foreign Application Priority Data

May 16, 2013 (EP) .................................... 13168070

(51) Int. Cl.
| | |
|---|---|
| *G06G 7/48* | (2006.01) |
| *G06F 17/50* | (2006.01) |
| *G05B 19/418* | (2006.01) |
| *G06Q 10/06* | (2012.01) |
| *G05B 17/02* | (2006.01) |

(52) U.S. Cl.
CPC ..... *G06F 17/5009* (2013.01); *G05B 19/4188* (2013.01); *G05B 19/41885* (2013.01); *G06Q 10/06* (2013.01); *G05B 17/02* (2013.01); *G05B 2219/31393* (2013.01); *G05B 2219/31398* (2013.01); *Y02P 90/20* (2015.11); *Y02P 90/24* (2015.11); *Y02P 90/26* (2015.11)

(58) Field of Classification Search
CPC .................................................. G06F 17/5009
USPC .............................................................. 703/6
See application file for complete search history.

(56) References Cited

U.S. PATENT DOCUMENTS

2008/0133029 A1* 6/2008 Heimke ................. G06Q 10/06
700/2

FOREIGN PATENT DOCUMENTS

| DE | 10111537 A1 | 9/2002 |
|---|---|---|
| DE | 102011082838 A1 | 3/2013 |
| EP | 1699005 A1 | 9/2006 |
| WO | WO 2006051076 A1 | 5/2006 |

\* cited by examiner

*Primary Examiner* — Hugh Jones
(74) *Attorney, Agent, or Firm* — Cozen O'Connor

(57) ABSTRACT

A method for monitoring a process and/or production plant, which includes a plurality of components and which is planned using a plurality of engineering systems, includes a step of providing first result data pertaining to at least one portion of the plurality of components using a first of the plurality of engineering systems, and second result data pertaining to at least one portion of the plurality of components using a second of the plurality of engineering systems. The method also includes a step of extracting topology data, which describe an arrangement of the plurality of components within the process and/or automation plant, and operating data for the plurality of components from the first and second result data. The method further includes creating a model for the process and/or production plant by using the topology data and the operating data. Also disclosed is an apparatus for carrying out the method.

11 Claims, 2 Drawing Sheets

METHOD FOR MONITORING A PROCESS AND/OR PRODUCTION PLANT

FIELD OF THE INVENTION

The present invention relates to a method and apparatus for monitoring a process and/or production plant that comprises a plurality of components and that is planned using a plurality of engineering systems. In addition, the present invention relates to an apparatus for monitoring a process and/or production plant.

DESCRIPTION OF THE RELATED ART

There are currently considerable shortcomings in conditioning information about a plant in a system-spanning manner. Electronically evaluable "as-built" plant documentation that is present in a standard form can still be obtained only in exceptional cases. This applies particularly when suppliers are involved, e.g., in distribution or in transport engineering. On account of the heterogeneity of the system landscape in engineering, the documents, data and programs they produce cannot be correlated in automated fashion today—this needs to be performed manually with a high level of involvement. Hence, not only the conditioning of the data but also, in particular, the safeguarding of the currentness (e.g., the up-to-date state) and consistency are a problem, since there are no standard mechanisms available therefor.

Not only is there a lack of products on the market that can be used to manage the results and to keep them up to date from an engineering process, there is even a lack of design principles therefor. Examples in this regard are the safeguarding of the consistency, the integration of the stakeholders, the tracking of changes on the plant by servicing and maintenance work, the standard version guidelines for "as-built" statuses and the like. If this problem is successfully solved with a suitable approach—and also the existent product ranges are incorporated—then it would be possible to generate a distinct added value for the customers. This problem arises particularly for the activities related to operations management phase, i.e., service and maintenance activities, but also for cause analysis.

Systems today for diagnosis or for visualization of process data, which are also called SCADA systems (SCADA—Supervisory Control and Data. Acquisition), usually have no knowledge of the plant itself. If such correlations are necessary, they need to be fully programmed in the respective systems. An example in this regard is the identification of leaks in compressed air lines, in the case of which the sensor system is usually cut down in order to contain leaks more precisely. Instead, reports from the originators and consumers are evaluated and this is used to attempt to draw inferences about the system. This currently requires the topology to be stored in the form of programs, which results in the programs needing to be analyzed and revised in the event of changes in the plant. If the topology of the plant is available in evaluable form in situ, on the other hand, the relevant lines can be traversed and originators and consumers correlated, so that generic diagnosis becomes possible.

Conventionally, data are interchanged between the engineering systems using import and export processes, and each system separately creates a portion of the plant documentation. The currentness and consistency of the documentation need to be ensured manually, especially since there is no version management for most tools in plant construction.

The documentation is (with the exception of automation and control engineering software) usually available as a PDF or TIFF document and cannot be evaluated further. For the operations management itself, individual systems are usually provided, such as MRO systems (MRO—Maintenance, Repair and Overhaul) or diagnosis systems. They usually need to import documents and/or data for the engineering systems. There is therefore no application-spanning or trade-spanning model available. In addition, the topology cannot be derived from these data and documents.

Document management systems (DMS) are in turn based on the documentation of the engineering systems. These also support version management for the documents. In some cases, there are systems that scan documents retrospectively and use the tagging to set up links at document level (e.g. in order to set up an electronic parts catalog). This involves version statements, release or the like additionally being stored in addition to the document. The topology of a plant likewise cannot be evaluated automatically for a DMS system, however.

Product data management systems (PDM) in turn see the engineering system as a central information hub, i.e., the documentation used in this case is the original systems. As a rule, systems for producing products also have version management. This involves the capture of CAD data (CAD—Computer Aided Design) and ERP data (ERP—Enterprise Resource Planning). There are ways of transferring this method to plant construction, e.g., delivering the engineering systems and data to the operator of the plant and involving them in the operations management, which is not possible with a PDM system, for example.

In the case of the engineering system COMOS, the MRO system uses the original engineering data directly, and is more or less a functional expansion of the CAF system (CAE—Computer Aided Engineering). This tool is intended only for the process industry, however. For the production industry, which traditionally involves a very large quantity of suppliers, such tools are not known. A disadvantage of the approach is that such an engineering tool cannot be optimized for the operations management and for the engineering in equal measure. Knowhow protection is likewise implementable only with difficulty. In addition, it can provide as a map only the data that it has integrated into its own engineering tool. Data from extraneous systems need to be imported manually and adapted to the data model, which makes currentness (i.e., up-to-date state) and consistency maintenance difficult.

A further problem is the need for various statements of task in plant construction to be implemented by such a tool. As a rule, this is a very expensive and risky path, since heterogeneous engineering systems need to be put onto a common platform with their complete scope of functions, which has usually come into being over years. In the past, multiple instances of such developments have failed, since the term of the development project means that they have likewise had to functionally expand the existing engineering systems for customers, and hence the implementation of the new system has become ever more difficult and more expensive. In many cases, such platform approaches are also no longer "best of breed", and a succession of customers also does not wish to make itself dependent on one supplier alone.

There is also the approach of standardizing underlying models and making products compatible with this standard, so that at least continuous interchange of data becomes possible (e.g. with the STEP program). In this case too, many efforts have been stranded, not least because the manufacturers of engineering tools do not wish their engineering tools to be interchangeable. In general, however, it can be stated that these models focus primarily on the interaction of the engineering tools rather than on the optimization of operations management.

SUMMARY OF THE INVENTION

It is an object of the present invention to demonstrate a way in which a process and/or production plant can be monitored more easily and more efficiently.

This object is achieved by a method and apparatus described in the following paragraph and the claims herein included.

The method according to the invention for monitoring a process and/or production plant, which comprises a plurality of components and is planned using a plurality of engineering systems, comprises providing first result data pertaining to at least one portion of the components using a first of the engineering systems. The method also comprises providing second result data pertaining to at least one portion of the components using a second of the engineering systems. The method further comprises extracting topology data, which describe an arrangement of the components within the process and/or automation plant, and operating data for the components from the first and second result data. The method also comprises creating a model for the process and/or production plant by using the topology data and the operating data.

The plurality of engineering systems provides different tools for planning and creating the process and/or production plant. These can be provided by a respective program, for example. The engineering systems can be provided by a CAE application, to which respective different technical aspects of the plant relate. The engineering systems each provides result data. In this case, principles that are used in CAE systems for revisions can be taken up. They represent—in a simple representation—views or reports of the data that have been checked in terms of content and then recorded. They are used for specifically passing on result data. Hence, these result data can be used to provide a map of the engineering process from the respective engineering system.

This map is a planning status of the plant and can be distinguished from statuses that are actually implemented on the plant or used. If these maps are managed in a standard manner, it is possible to put version management in place that can be used to distinguish these statuses. In this case, the result data can be provided in the order of the engineering process for planning the plant. The result data can be provided in a form that is evaluable for data processing purposes. By way of example, the result data can be provided in XML format. The use of the result data simplifies the use of the data since these data are usually no longer based directly on the internal data management of the engineering systems, but rather use a standardized view thereof (e.g., in the form of schematic or terminal diagrams).

Topology data that describe the operative connection of the components of the plant are extracted from the result data of at least two of the engineering systems. In addition, operating data for the components of the plant are extracted. From the topology data, it is possible to progressively create a model or a digital map of the plant and to correlate it to the current process data for the plant. In this case, the topology data and the operating data can also be provided with knowhow protection. This also makes it possible to prevent third parties, such as suppliers, from accessing the data. The use of the result data instead of the original data of the engineering tools provides knowhow protection, since the data of the map are usually insufficient to perform engineering for the plant.

Such a model can be used for optimizing the operations management. In the medium to long term, such a map can result in merging of the underlying engineering applications. It can result not only in standard report systems being produced but also in properties of such a map progressively being used in the development of the applications, without the applications having to give up their autonomy.

In a preferred embodiment, the arrangement of the components within the process and/or automation plant and the operating data pertaining to the respective components are displayed in a representation of the model. In the release process in the respective engineering systems, the result data can be output in the form of a vector-graphic and an associated meta-model. In this case, the representation of the model may be designed such that the components of the plant are identifiable and selectable as an object in the representation. In addition, it is possible to set up a correlation between the graphical element and the meta-model that stores the operating data for the component, for example.

In one embodiment, the topology data extracted are a respective input-side and output-side operative connection of the components among one another. Hence, the connections between the individual components in the plant can easily be sensed and a model or map of the plant can be provided in a reliable manner.

In a further embodiment, the first or second result data provided by the engineering systems are a three-dimensional model, a pipeline plan and/or a conduction plan. The engineering systems for planning the plant may relate to different technical areas. In this case, the results of the engineering systems can be used in the form of the result files. This means that only the data that are relevant to operation of the plant will be used for creating the digital model for the plant.

In a preferred embodiment, the first or second result data provided by the engineering systems are data sheets and/or operating parameters for the components. This means that operating variables for the respective components that are used in the plant can additionally be integrated into the model. Hence, by way of example, engineering objects such as motors or pumps can be combined with process data such as operating hour's meters or alarms. While engineering systems may have storage and handling optimized for the planning and design of plants, the map may be designed for the operations management phase.

In a further embodiment, the topology data and operating data extracted from the first and second result data are converted into a predetermined data format. The result data can be managed in a standard form, as a result of which generic functions for looking for and traversing data are possible. This means that service and diagnosis applications can be used in a standard manner.

In a preferred embodiment, the topology data and operating data are additionally attributed origin data that describe whether the topology data and operating data are extracted from the first or the second result data. In this way, it is possible to provide an origin function that can be used to track from which result file or from which engineering system data come.

In a preferred embodiment, a link to the first and second result data is provided in the model. This allows the provision of an option for changing from the digital map to the underlying engineering system while taking account of the object correlation. If a component in the graphical representation selects a pipeline plan, for example, it may be possible to change to the associated CAE application in which the pipeline plan was produced. A prerequisite for this is naturally that these applications are available on the plant.

In a further embodiment, the model is adjusted in the event of a change in the first and/or second result data. This means that data from different applications or trades can be integrated without the need for complete re-implementations in the engineering and/or runtime systems.

In a preferred embodiment, the change in the first and/or second result data is indicated in the model. In general, it is possible to support version management of the data, even if the engineering systems do not perform it. The design of the model should be integrated into the engineering process such that it is kept current and consistent. Changes to the plant—past the engineering process—may be detected in this case and can be transferred to the associated engineering systems. Furthermore, service and maintenance engineers can handle the model of the plant seamlessly. This means particularly that the reports used to date for the representation and contents of the plant can be made available in an analogous form.

The apparatus according to the invention for monitoring a process and/or production plant, which comprises a plurality of components and is planned using a plurality of engineering systems, comprises a reception device for receiving first result data pertaining to at least one portion of the components from a first of the engineering systems and for receiving second result data pertaining to at least one portion of the components from a second of the engineering systems, and a computation device for extracting topology data, which describe an arrangement of the components within the process and/or automation plant, and operating data for the components from the first and second result data and for creating a model for the process and/or production plant by using the topology data and the operating data.

The developments described in connection with the method according to the invention can be applied to the apparatus according to the invention, and vice versa.

BRIEF DESCRIPTION OF THE DRAWINGS

The present invention is now explained in more detail with reference to the appended drawings, in which.

DETAILED DESCRIPTION OF THE PRESENTLY PREFERRED EMBODIMENTS

The embodiments outlined in more detail below are preferred embodiments of the present invention.

Figure 1:
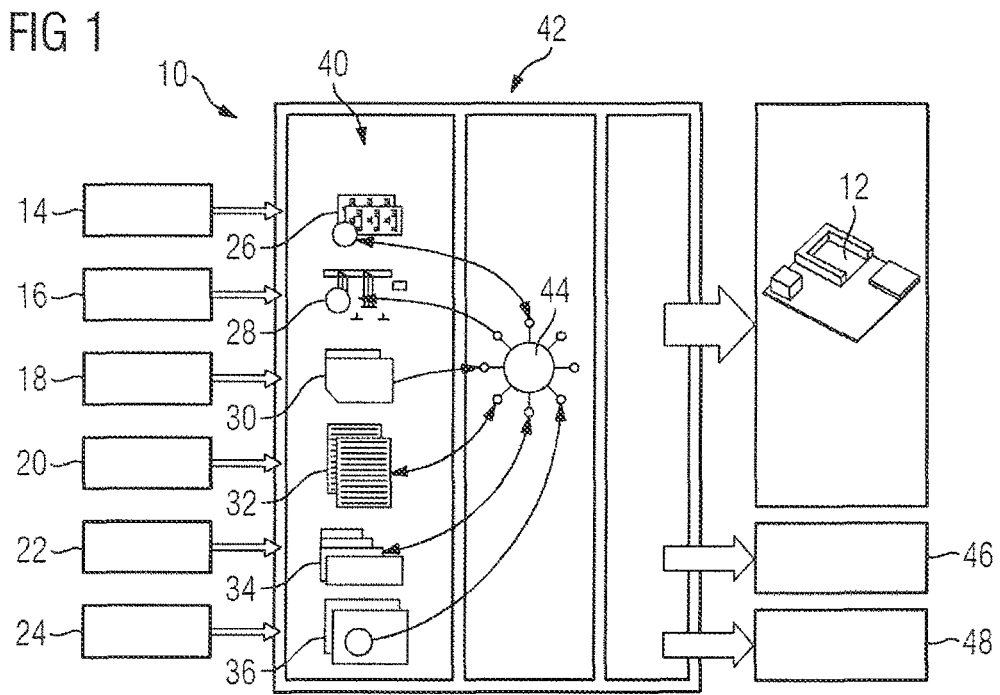
FIG. 1 shows a schematic illustration of an apparatus for checking a process and/or production plant in accordance with one embodiment of the present invention.

FIG. 1 shows a schematic illustration of an apparatus 10 for checking a process and/or production plant 12 in accordance with one embodiment of the present invention. The process and/or production plant 12 is planned using a plurality of engineering systems. In the present case, the plant 12 is planned using six engineering systems 14, 16, 18, 20, 22, and 24. The engineering systems 14, 16, 18, 20, 22, 24 relate to different technical areas. By way of example, engineering system 14 can be used to provide a pipeline and installation plant. The engineering system 16 can be used to provide a schematic diagram. The engineering system 18 can be used to provide a three-dimensional plan of the plant 12. The engineering system 20 can be used to provide data sheets pertaining to the components 44 of the plant 12. The engineering system 22 can be used to provide continuous function charts (CFC) for a programmable logic controller. Finally, the engineering system 24 can be used to provide process visualization.

When the planning of the plant 12 using the respective engineering systems 14, 16, 18, 20, 22, 24 has concluded, each of the engineering systems 14, 16, 18, 20, 22, 24 outputs associated result data 26, 28, 30, 32, 34, 36. These result data 26, 28, 30, 32, 34, 36 are received by a reception device 40 of the apparatus 10. A computation device 42 of the apparatus 10 is used to extract topology data, which describe an arrangement of the components 44 within the process and/or production plant 12, and operating data for the components 44. From the topology data and the operating data, a model or digital map of the plant 12 is created by using the computation device 42. In addition, the apparatus 10 has a user interface 46 and an interface 48 for connecting further services, which can be used for diagnosis services or for service-related and maintenance-related activities, for example.

Since the revised reports and documents in the form of the result data 26, 28, 30, 32, 34, 36 are produced in line with the order of the engineering process, it can be assumed that central correlation components are defined at the beginning and are later enhanced by information. This model 50 is then implicitly updated or set up when the revision statuses are formed (or when documents are released), as a result of which the model 50 is seamlessly incorporated into the engineering process. In one embodiment, it may be necessary for appropriate reports or revisions to be expanded such that the result data 26, 28, 30, 32, 34, 36 are forwarded in an evaluable format. The model 50 does not support any engineering functionality, but the model 50 is optimized for trade-spanning and application-spanning navigation. In addition, the model 50 serves as a standard basis for comparing the planning status of the plant with that of the real status independently of application, and changes in the engineering data need to be made using the original tools. For transmission to and from, references to the original data and applications are managed (proof of origin). Since the data are managed in a metamodel in a standard manner, standard functions such as queries, reports, version managers or the like can also be implemented.

Figure 2:
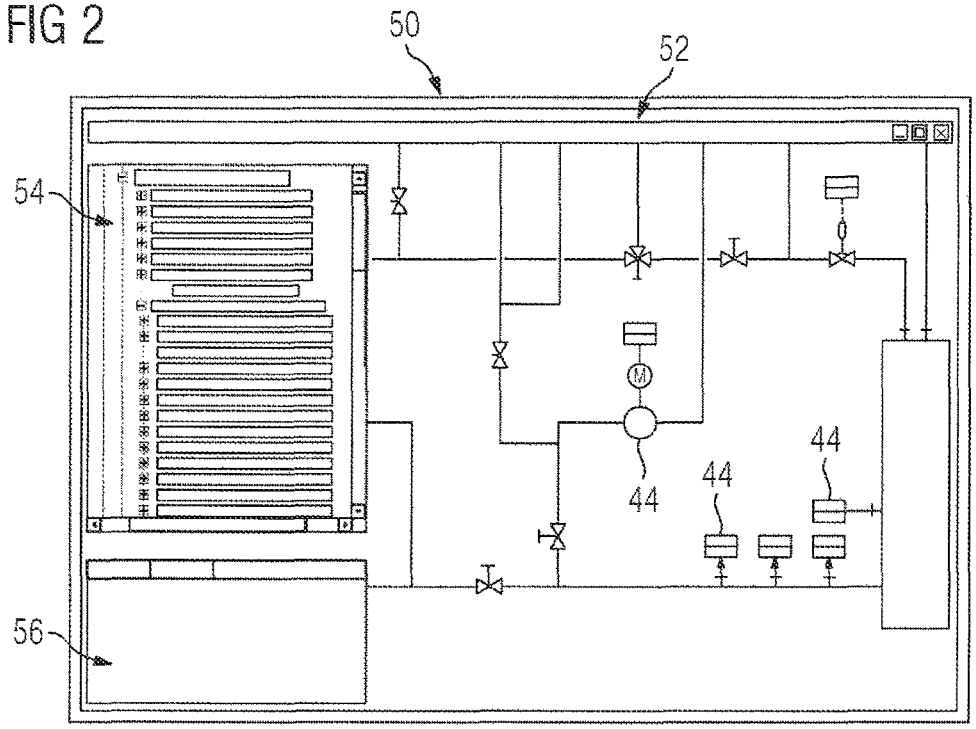
FIG. 2 shows an illustration of a model of the process and/or production plant in accordance with one embodiment of the present invention.

FIG. 2 shows a model 50 of the plant 12 in the representation in a 2D viewer in accordance with one embodiment of the present invention. A first window 52 graphically shows the individual components 44 of the plant 12 and the operative connection thereof (in this case a pipeline and installation diagram). A second window 54 lists the individual components 44. In this case, the result data 26, 28, 30, 32, 34, 36 from the engineering systems 14, 16, 18, 20, 22, 24, respectively, can be presented such that the connection between the metamodel and the associated graphical representation can be tracked. By way of example, a component 44 can be selected in the plant hierarchy in the second window 54 and highlighted in the associated pipeline and instrumentation plan in the first window 52. In addition, operating variables for the selected component 44 can be displayed in a third window 56.

The various revisions or releases of documents and data in the engineering process in the form of the result data 26, 28, 30, 32, 34, 36 produce progressive submaps of the plant 12. These are used to implicitly expand or update the trade-spanning model 50. For the digital map, these data and documents are connected. Since only released documents and data are used, the effect achieved is also that only such information as has a certain degree of maturity is transferred to the model 50. If work statuses are combined, there is the risk that statuses that are inconsistent with one another will recurrently occur, entailing corresponding additional involvement. The engineering process is used to prescribe a certain order in which these documents and data are produced. By way of example, first a pipeline and installation plan (P&ID) is created before device specifications for the components 44 in the diagram are produced. The specifications are then linked to the components 44 of the pipeline and installation diagram.

An important aspect is that it is not documents or plans "per se" that are linked, but rather objects of these documents. By way of example, it needs to be possible to obtain for a pump in a P&ID associated documents such as schematic diagrams, or product descriptions for the respective manufacturer, as well as data such as power details and limit values. The objects may have a wide variety of—including trade-spanning—correlations, such as a correlation between the pump and an associated CFC plan. The map 50 may need to have a generic (expansible) character for this purpose.

As a basis for this, there may be a need for joint object terms (e.g. pertaining to plant objects). In general, it holds that there need to be explicit stipulations within a project that govern the correlation of the objects, plans and documents (e.g., using the tagging system used in the project). For this reason, an assumption is made that such relationships can be generated automatically using rules, as a result of which no additional engineering effort is required for producing the model 50. Should the underlying information nevertheless be inadequate in certain cases or the rules that should be derived therefrom become too complicated, additional data may be managed in the engineering systems 14, 16, 18, 20, 22, 24.

By way of example, fill level measurement is defined by a file name in a CAE system. In the associated CFC, a different file name is indicated instead. For generic linking, these details should to be normalized. For example, corresponding terms may be extracted from the file names. This type of tagging may differ from project to project. Within a project, there are normally standard conventions, however, which mean that it is possible to derive appropriate automatisms. Otherwise, the documentation of the plant is also not coherent.

At first glance, this map 50 produces dual data management. However, the data management is currently likewise present because currently used revision documents are nothing other than deductions of the data from the engineering systems 14, 16, 18, 20, 22, 24. An important aspect in that connection is that, the model 50 works in the sense of a cache and does not form separate engineering data management that would need to be made consistent as appropriate. For this reason, application-spanning relationships should be derivable on the basis of existent information.

The advantage of managing the result data 26, 28, 30, 32, 34, 36 from the engineering systems 14, 16, 18, 20, 22, 24 in a map 50, which is separated from the applications, is that this map 50 does not require constant connection to the applications, and the interface rather has the character of a "loosely coupled system". This is also desired since it can be assumed that not all the engineering tools are installed in situ and accessible on line. In the case of deliveries from third-party companies, there is usually no access to the original tools, but the documents and data required for starting up and operation are passed on. This information can be integrated into the map 50 on the basis of the same pattern (possibly with a restricted scope of functions).

The approach of retrospectively combining the result documents (e.g. PDF documents and CAD drawings) produced from the applications to produce linked electronic documentation is known. However, these systems always encounter the problem of retrospectively converting documents that have already been produced into such a linked structure. This is linked to considerable involvement in some cases, since, by way of example, tags in the documents need to be identified and analyzed (e.g., relative path details should be compiled). Manufacturers of engineering tools can make these data available much more easily by making appropriate export structures available. This is also an important aspect or concept of the present invention.

The forwarding of result data in the form of revised reports is desired because many engineering systems 14, 16, 18, 20, 22, 24 (particularly CAE systems) do not have genuine version management for data. In the case of a released status, however, there needs to be—besides ongoing backup—a way of identifying changes to this status retrospectively.

A further reason for the production of documents is that forwarding of data to a customer or a third-party company is usually possible only when said customer/company uses exactly the same tool, since there are barely established standards for data management in the plant surroundings. The document form gets around this problem, especially since the document types (e.g. schematic diagrams) have a much better degree of standardization.

For the model 50 or map, the following consequences arise therefrom: at the moment, only the revisions can be used as a basis for converting engineering data into a plant 12. If engineering systems 14, 16, 18, 20, 22, 24 permit version management; it is possible for appropriately labeled statuses of the tools to be used as a basis. On account of the volume structures to be managed and the required flexibility of the data management (a wide variety of tools need to be incorporated into the projects), however, it may also make sense to convert the data into a separate map in this case. The contents of these revisions should be provided with an evaluable character that can be coordinated in an application-spanning manner (at least at the interfaces of the result data 26, 28, 30, 32, 34, 36). The map 50 should act as a database for redlining because otherwise changes to the plant 12 would not be sensed. The map 50 needs to provide a way of revealing changes in comparison with released statuses of the applications.

Especially the latter requirement is important. Only a separate model 50 is capable of affording version management for engineering data (e.g., "as-built" statuses) in a trade-spanning and application-spanning manner. In addition, the design of the model 50 allows redlining functions to be provided in a standard application-spanning manner. The proof of origin can be used to forward these changes to the original applications.

The data from the applications need to be transformed for the metamodel of the digital map 50. Although this step takes place only when data are released, this can nevertheless result in performance problems in the case of large volume structures. For such cases, the applications in question can support delta generation in order to forward only amended portions. The map 50 then conversely needs to be able to process such a delta list.

Although drawings and plans that are transferred from the engineering systems 14, 16, 18, 20, 22, 24 should be evaluable (for example, objects need to be identifiable), they show finished results and do not need to be set up from complex data management. Only in this way is it possible for the volume structures that arise for large plants (e.g., 13,000 schematic and function diagrams in the case of luggage handling plants) to be managed with a good level of performance. Navigation that needs to constantly search various extensive data management systems in order to select plans and data would hardly be accepted for service and maintenance purposes.

Since all the drawings and data are present in a standard form, the drawings and data transferred in this manner are linked to process data for the plant. By way of example, it is now possible to show diagnosis information pertaining to components such as pumps directly in P&ID diagrams. For the maintenance engineer, this means that first, he can continue to work with the familiar documents and second, he is also provided with current information from the plant. It is important to use the naming of the objects to set up a connection pertaining to the data of the SCADA or diagnosis systems.

Objects and documents need to have a proof of origin in order to be able to delegate changes to the original tools. Data and documents always have tagging that can be used to explicitly identify them (within the present project). For connection to the original applications, this information needs to be augmented by details, however, so that the underlying application project or the application itself can be identified. Such proof of origin allows bookkeeping concerning which tools and stores have been used in the present project and where they can be found. One problem with the approach is the unambiguity of the association with the data. In this case, it is inevitable that data can occur in a plurality of engineering tools and can also be changed therein. The fact that there is a large amount of overlapping information in the tools may lead to this circumstance. In some cases, however, it may be assumed that there are stipulations concerning who is responsible for which data. This responsibility then also needs to be reflected in the proof of origin.

Figure 3:
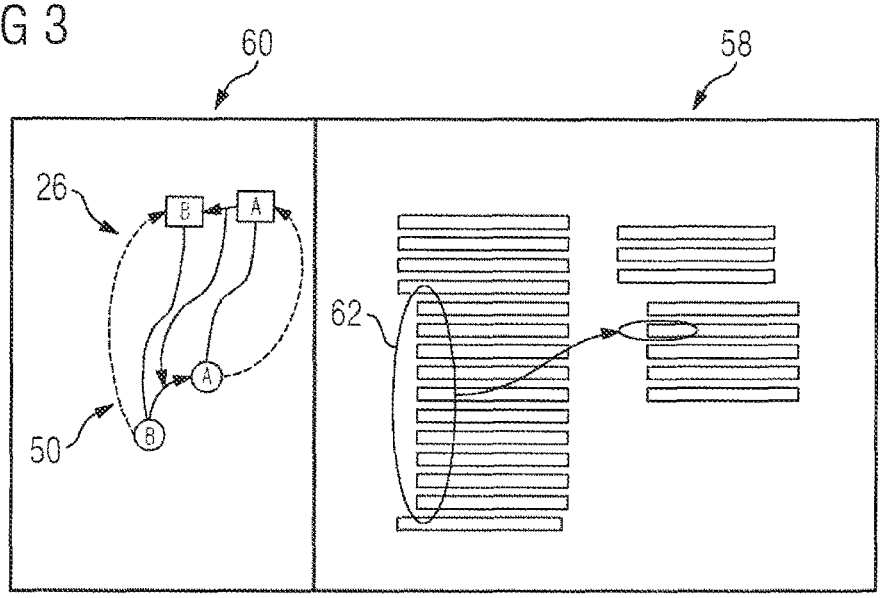
FIG. 3 shows a schematic illustration of a demonstrator in accordance with one embodiment of the present invention.

FIG. 3 shows a schematic illustration of a demonstrator 58 in accordance with one embodiment of the present invention. For a demonstrator 58, the engineering system 14 (e.g. COMOS V9.0) has been used as a platform for the digital model 50, and the data from a project of the CAE system have been transferred to the map 50. In this regard, functions that have been incorporated can bring about appropriate discharge when a revision is produced. The discharge itself is kept in a configurable manner. Since the structure of the underlying system is retained, it would be sufficient in the cases under consideration to store a piece of information for the objects and relations of the CAE system concerning whether or not they are relevant to the digital map 50. The subsequent images clarify this using the example of a pipeline and instrumentation diagram.

The left-hand window 60 shows the mapping of the CAE data A and B of the result data 26 onto the data A' and B' (i.e., A and B enclosed in a circle) of the model 50. In general, the engineering result cannot have more information than the engineering itself, but there are a series of simplifications. By way of example, structures for storage that do not perform tagging are managed for the engineering. These then likewise do not appear in the pipeline and instrumentation diagram and are dispensed with in the digital map. In addition, the engineering system 14 needs to manage an extensive library with the components that are to be used. By contrast, however, the map 50 has only the elements that are actually used.

The elements themselves can likewise be simplified. By way of example, in the example above, the CAE system needs to manage different types for container 62 if the graphical representation changes (even though the attribution is identical). For this purpose, the CAE system needs to manage different principal objects (types) for containers with straight, concave or convex bases, etc. This is irrelevant to the map 50 because the drawing is transferred in a finished condition and the attribution is identical. In principle, the map 50 does not require a type instance concept at all. In the present case, the present CAE system has presupposed such a structure, which means that this has not been implemented in the demonstrator 58. However, the example shows that the library information that holds the knowhow of the plant constructor does not need to be used in this way in the map 50 and hence knowhow protection is also provided. The only supplementary information that is needed is structuring of the storage of the map 50. This requires—besides the indication of the target map itself—structure nodes to be indicated as destinations when configuring the discharge.

In a subsequent step, the data transferred in this manner need to be linked to data from other engineering systems. This requires two steps. A configuration file is used to specify what types of relations need to be produced between the applications (including statements such as one-to-one, one-to-many relations, etc.) and, in a second step, on what basis it is necessary to set up links between the associated instances.

Since the data from the map 50 are in a standard form, it is also possible to provide standard redlining functions. Furthermore, because a proof of origin is managed such changes can be transferred to the respective target application. On the basis of the viewer shown at the outset in accordance with FIG. 2, it is possible to sense attribute changes (albeit without semantic checks). The amended value can be marked red, for example. The data and drawings changed in this manner are then transferred to the map 50 and, from there, are handed over to the respective application by using the proof of origin. One advantage of the method, among others, is that the map 50 can be used to sense such changes using the version management in a standard manner.

Figure 4:
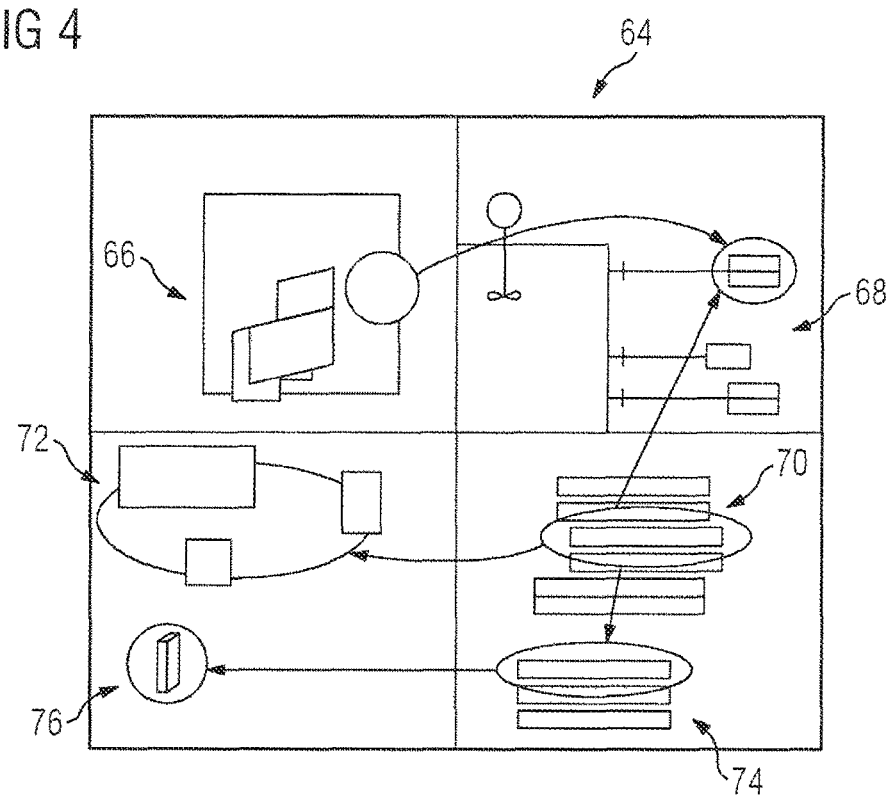
FIG. 4 shows a schematic illustration of the apparatus for checking a process and/or production plant in accordance with one embodiment of the present invention.

FIG. 4 shows an example of the use of such a system, the example being implemented in a demonstrator 64, in accordance with one embodiment of the present application. Starting from a 3D drawing 66, the sequence branches to the associated pipeline and instrumentation plan 68 and from there to the associated function code in the controller 70. Starting from the map 50, the proof of origin (arrow 72) can be used to start the engineering tool and to display the associated result file 72 (in this case in the form of a CFC). In addition, the function code in the map can find the associated memory device 74 or CPU and, using the order number thereof, open the service and maintenance portal 76 directly.

In the past, multiple attempts have been made to set up what are known as common information models that should provide standard access to engineering data. The present model differs from conventional approaches by virtue of the following features:

For one, it is not necessary to manually initiate separate export in order to produce such a model 50 from engineering systems 14, 16, 18, 20, 22, 24. Setup occurs implicitly in the case of release methods in the engineering.

For two, no complex deductions of engineering data are used, but rather the result data 26, 28, 30, 32, 34, 36 are used exclusively. The data are transferred in a structured form in line with the release method in the engineering or the creation of the documentation for the plant 12. The model 50 is set up progressively in line with the project progress.

For three, the result data 26, 28, 30, 32, 34, 36 from the engineering systems 14, 16, 18, 20, 22, 24 are linked generically. It is possible to define rules for the projects that connect the data by using the tagging.

For four, the model 50 uses the structures that have the underlying engineering systems 14, 16, 18, 20, 22, 24. Such structures include the plant structure of a CAE tool and technological (functional) hierarchies from the automation tools. Although a common metamodel is present, this is used to allow standard access to data and relations. This is a fundamental principle, since it is possible in this way for a proof of origin to be used to manage a correlation to the underlying tools and hence for changes in situ on the plant 12 to be easily transferred to the tools.

For five, result data 26, 28, 30, 32, 34, 36 such as R&I diagrams or schematic diagrams, have a relatively high level of standardization in comparison with the data management of the applications themselves. If only the data from these reports are used in the release method, this likewise achieves certain standardization, even if fundamental structure elements are the basis for a source application. The approach of taking only these revised documents with the associated data as a basis means that the system is capable of also incorporating data from extraneous applications, provided that the system permits appropriate discharge from revised documents. This is an important aspect of the approach.

For six, proofs of the origin can be used to match data from the map 50 against the data from the engineering systems 14, 16, 18, 20, 22, 24 and hence to keep them current and consistent.

For seven, the map 50 is not a map of the engineering systems 14, 16, 18, 20, 22, 24 but rather is optimized for operations management of plants 12. It allows plant documents to be connected to process data and diagnosis programs to be set up (e.g., compressed air lines can be traversed in order to identify and locally contain leaks using reports from the connected consumers and originators).

For eight, a substantial aspect of the approach is that this form of integration can be affected progressively with low risk. Only engineering results that represent an abstraction layer for the data management of the engineering tools (e.g., implicitly implemented by reports or export structures) are considered. The internal data management of the tools does not need to be changed; only "views" of this data management are used. However, it is necessary for these results to be coordinated with one another. This can be affected in steps by gradually adding results from tools. This coordination is a basic prerequisite when engineering tools need to be configured continuously.

For nine, the production of the map 50 is a type of quality control for the interaction of the result data. Engineering applications can keep only the data that they manage themselves consistent. By contrast, missing application-spanning references cannot be identified. This would be reported when the map is set up, however.

For ten, once such a model has been established and has features such as version management or trade-spanning selections, the engineering tools—although remaining as separate developments—will sooner or later merge in respect of these common features. This takes place implicitly on account of market pressure.

The series of detailed descriptions set forth above are only specific descriptions directed to the feasible embodiments of the present invention, and are not intended to limit the scope of protection of the present invention. All the equivalent embodiments or modifications made without departing from the technical spirit of the present invention shall be included in the scope of protection of the present invention.

What is claimed is:

1. A method for monitoring at least one of a process plant and a production plant which includes a plurality of components and which is planned and created via a plurality of engineering systems based on a model created for at least one of the process plant and the production plant to ensure efficient operation of least one of the process plant and the production plant planned and created based on the model, the method comprising:
   providing first result data pertaining to at least one portion of the plurality of components using a first of the plurality of engineering systems;
   providing second result data pertaining to at least one portion of the plurality of components using a second of the plurality of engineering systems;
   extracting topology data, which describe an arrangement of the plurality of components within at least one of the process plant and the production plant, and extracting operating data of the plurality of components from the first and second result data;
   creating the model for at least one of the process plant and the production plant by using the extracted topology data and the extracted operating data of the plurality of components from the first and second result data, said model optimizing operation of at least one of the process plant and the production plant; and
   monitoring at least one of the process plant and the production plant based on the model created from the extracted topology data and the extracted operating data of the plurality of components via the plurality of engineering systems to ensure efficient operation of least one of the process plant and the production plant planned and created based on the model via the plurality of engineering systems.

2. The method of claim 1, wherein the arrangement of the plurality of components within at least one of the (i) process plant and (ii) the production plant, and within the operating data pertaining to the respective components are displayed in a representation of the model.

3. The method of claim 1, wherein the extracted topology data are a respective input-side and output-side operative connection of the components among one another.

4. The method of claim 1, wherein at least one of the first result data and the second result data provided respectively by the first and second of the plurality of engineering systems is one of a three-dimensional model, a pipeline plan and a conduction plan.

5. The method of claim 1, wherein at least one of the first result data and the second result data provided respectively by the first and second of the plurality of engineering systems is one of data sheets and operating parameters for the components.

6. The method of claim 1, wherein the topology data and the operating data extracted from the first and second result data are converted into a predetermined data format.

7. The method of claim 1, wherein the topology data and the operating data include additionally attributed origin data that describe whether the topology data and the operating data are extracted from which of the first and second result data.

8. The method of claim 1, wherein a link to the first and second result data is provided in the model.

9. The method of claim 1, wherein the model is adjusted in the event of a change in at least one of the first and second result data.

10. The method of claim 9, wherein the change in at least one of the first and second result data is indicated in the model.

11. An apparatus for monitoring at least one of a process plant and a production plant which includes a plurality of components and which is planned and created via a plurality of engineering systems based on a model created for at least one of the process plant and the production plant to ensure efficient operation of least one of the process plant and the production plant planned and created based on the model, the apparatus comprising:

a reception device configured to receive first result data pertaining to at least one portion of the plurality of components from a first of the plurality of engineering systems, and configured to receive second result data pertaining to at least one portion of the plurality of components from a second of the plurality of engineering systems; and a computation device configured to extract topology data, which describe an arrangement of the plurality of components within at least one of the process plant the production plant, and to extract operating data of the plurality of components from the first and second result data, and to create the model for at least one of the process plant and the production plant by using the extracted topology data and the extracted operating data of the plurality of components from the first and second result data, said model optimizing operation of at least one of the process plant and the production plant;

wherein at least one of the process plant and the production plant planned based on the model, via the plurality of engineering systems, created from the extracted topology data and the extracted operating data of the plurality of components, is monitored to ensure efficient operation of least one of the process plant and the production plant planned and created based on the model via the plurality of engineering systems.

* * * * *